United States Patent
Xi et al.

(10) Patent No.: US 10,379,403 B2
(45) Date of Patent: Aug. 13, 2019

(54) PIXEL UNIT AND METHOD FOR MANUFACTURING THE SAME

(71) Applicant: AU OPTRONICS CORPORATION, Hsin-chu (TW)

(72) Inventors: Peng-Bo Xi, Hsin-chu (TW); Sung-Yu Su, Hsin-chu (TW); Chu-Hsuan I, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 48 days.

(21) Appl. No.: 15/802,017

(22) Filed: Nov. 2, 2017

(65) Prior Publication Data

US 2018/0284542 A1 Oct. 4, 2018

(30) Foreign Application Priority Data

Mar. 29, 2017 (TW) .............................. 106110571 A

(51) Int. Cl.
*G02F 1/1337* (2006.01)
*G02F 1/1362* (2006.01)
*G02F 1/1368* (2006.01)
*H01L 27/12* (2006.01)

(52) U.S. Cl.
CPC ...... *G02F 1/133707* (2013.01); *G02F 1/1368* (2013.01); *G02F 1/136286* (2013.01); *H01L 27/1259* (2013.01); *G02F 2001/136295* (2013.01)

(58) Field of Classification Search
CPC ......... G02F 1/133707; G02F 1/136286; G02F 1/1368; G02F 2001/136295; H01L 27/1259

USPC .............................................................. 257/59
See application file for complete search history.

(56) References Cited

U.S. PATENT DOCUMENTS

| 8,487,311 B2 | 7/2013 | Liu et al. | |
| 2007/0290246 A1* | 12/2007 | Zhang | H01L 27/14634 257/294 |
| 2009/0159890 A1* | 6/2009 | Yamazaki | H01L 27/1266 257/59 |
| 2010/0230763 A1* | 9/2010 | Sun | H01L 27/14609 257/390 |

(Continued)

FOREIGN PATENT DOCUMENTS

TW 201628096 A 8/2016

OTHER PUBLICATIONS

Office Action issued by (TIPO) Intellectual Property Office, Ministry of Economic Affairs, R. O. C. dated Dec. 29, 017 for Application No. 106110571, Taiwan.

*Primary Examiner* — Tong-Ho Kim
(74) *Attorney, Agent, or Firm* — Locke Lord LLP; Tim Tingkang Xia, Esq.

(57) ABSTRACT

A method for manufacturing a pixel unit includes the following steps. A channel layer is formed. A first pattern layer is formed above the channel layer and includes a scan line and a gate electrode. A second pattern layer is formed above the first pattern layer and includes a data line and a source electrode, where the source electrode is electrically connected to the channel layer. A third pattern layer is formed above the second pattern layer and includes a drain electrode and an auxiliary electrode, where the drain electrode is electrically connected to the channel layer. The auxiliary electrode is electrically connected to the scan line through a first contact hole.

15 Claims, 12 Drawing Sheets

(56) References Cited

U.S. PATENT DOCUMENTS

| | | |
|---|---|---|
| 2012/0105784 A1 | 5/2012 | Ho et al. |
| 2012/0313100 A1* | 12/2012 | Liu .................... H01L 27/1214 257/59 |
| 2012/0315730 A1 | 12/2012 | Koezuka et al. |
| 2016/0307986 A1 | 10/2016 | Gai et al. |

* cited by examiner

PIXEL UNIT AND METHOD FOR MANUFACTURING THE SAME

CROSS-REFERENCE TO RELATED PATENT APPLICATION

This application claims priority to and the benefit of, pursuant to 35 U.S.C. § 119(a), patent application Ser. No. 10/611,0571 filed in Taiwan on Mar. 29, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a pixel unit and a method for manufacturing the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Liquid crystal displays to which thin film transistors (TFTs) are applied have been widely used in various consumptive electronic products. A thin film transistor-type liquid crystal display is mainly constituted by a thin film transistor array substrate, a color filter array substrate, and a liquid crystal layer. Multiple thin film transistors arranged in an array and pixel electrodes each configured in correspondence to each thin film transistor are disposed on the thin film transistor array substrate to constitute pixel structures.

However, in response to various consumptive demands, sizes of liquid crystal displays to which thin film transistors are applied already have a lot of variations, and applications thereof from small sizes to large sizes all have been gradually developed. When a display with a large size is applied, and is designed to have high resolution, a design rule of a pixel structure process seems to be tougher. In view of this, as the design rule becomes tougher, when there is an unexpected situation in the process, display quality of the display will be affected.

SUMMARY

An implementation manner of the present invention provides a method for manufacturing a pixel unit, where in a process of manufacturing the pixel unit, a step of forming a data line is prior to a step of forming a conductor electrically connected to a channel layer and a scan line, and at least one step of forming an insulation layer is between the two steps, so that the data line can be prevented from being connected to a conductor inside a second contact hole and causing a short-circuit. Therefore, the performed process may have a broader design rule and have a better yield, so as to prevent display quality of a device to which the pixel unit is applied from being affected.

An implementation manner of the present invention provides a method for manufacturing a pixel unit, including the following steps: forming a channel layer; forming a first pattern layer above the channel layer, the first pattern layer including a scan line and a gate electrode; forming a second pattern layer above the first pattern layer, the second pattern layer including a data line and a source electrode, where the source electrode is electrically connected to the channel layer; and forming a third pattern layer above the second pattern layer, the third pattern layer including a drain electrode and an auxiliary electrode, where the drain electrode is electrically connected to the channel layer, and the auxiliary electrode is electrically connected to the scan line through a first contact hole.

In some implementation manners, the method for manufacturing a pixel unit further includes: forming a first electrode and a second electrode above the third pattern layer.

In some implementation manners, the method for manufacturing a pixel unit further includes: forming a planarization layer above the third pattern layer, and forming a second contact hole in the planarization layer, where the first electrode is located above the planarization layer, and is electrically connected to the drain electrode through the second contact hole.

In some implementation manners, one part of the auxiliary electrode is located inside the first contact hole, and when being observed along a horizontal direction, the data line does not overlap with the other part of the auxiliary electrode.

In some implementation manners, the drain electrode is electrically connected to the channel layer through a third contact hole, and one part of the drain electrode is located inside the third contact hole, where when being observed along another horizontal direction, the data line does not overlap with the other part of the drain electrode.

In some implementation manners, the method for manufacturing a pixel unit further includes: forming an insulation layer, where the step of forming the insulation layer is posterior to the step of forming the second pattern layer, and is prior to the step of forming the third pattern layer, and the first contact hole at least passes through the insulation layer.

An implementation manner of the present invention provides a pixel unit, disposed on a substrate and including: a channel layer, a first insulation layer, a first pattern layer, a second pattern layer, a third insulation layer, and a third pattern layer. The channel layer is disposed on the substrate. The first insulation layer covers the channel layer. The first pattern layer is disposed on the first insulation layer and includes a scan line and a gate electrode, where a vertical projection of the gate electrode onto the substrate at least partially overlaps with a vertical projection of the channel layer onto the substrate. The second insulation layer is disposed on the first insulation layer and covers the first pattern layer, where the first insulation layer and the second insulation layer share a first contact hole. The second pattern layer is disposed on the second insulation layer and includes a data line and a source electrode, where the source electrode is electrically connected to the channel layer through the first contact hole. The third insulation layer is disposed on the second insulation layer and covers the second pattern layer, where the second insulation layer and the third insulation layer share a second contact hole, and the first insulation layer, the second insulation layer, and the third insulation layer share a third contact hole. The third pattern layer is disposed on the third insulation layer and includes a drain electrode and an auxiliary electrode, where the auxiliary electrode is electrically connected to the scan line through the second contact hole, and the drain electrode is electrically connected to the channel layer through the third contact hole.

In some implementation manners, when being observed along a first horizontal direction, one part of the data line does not overlap with the auxiliary electrode.

In some implementation manners, one part of the drain electrode is located inside the third contact hole, and when being observed along a second horizontal direction, the data line does not overlap with the other part of the drain electrode.

In some implementation manners, one part of the auxiliary electrode is located inside the second contact hole, and when being observed along a first horizontal direction, the data line does not overlap with the other part of the auxiliary electrode.

In some implementation manners, the pixel unit further includes a planarization layer, a first electrode, a passivation layer, and a second electrode. The planarization layer covers the third pattern layer and includes a fourth contact hole. The first electrode is disposed on the planarization layer and is electrically connected to the drain electrode through the fourth contact hole. The passivation layer covers the first electrode. The second electrode is disposed on the planarization layer and is electrically isolated from the first electrode by means of the passivation layer.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

A plurality of implementation manners of the present invention is disclosed below with reference to the accompanying drawings. For clear description, many details in practice will be described together in the following description. However, it should be understood that these details in practice should not be used to limit the present invention. That is, in some implementation manners of the present invention, these details in practice are not essential. In addition, to simplify the accompanying drawings, some conventional structures and elements are shown in a simple schematic manner in the accompanying drawings.

Herein, it may be understood that words, such as first, second, and third, are used to describe various elements, components, regions, or layers. However, these elements, components, regions, or layers should not be limited by these terms. These words are only used for distinguishing between single elements, components, regions, or layers. Therefore, a first element, component, region, or layer hereinafter may also be referred to as a second element, component, region, or layer without departing from the concept of the present invention.

In the implementation manners and the claims, unless an article in the present disclosure is particularly defined, the words "a" and "the" may generally refer to a single form or a plural form. It should be further understood that when "include", "comprise", "have", and similar terms used in the present disclosure clearly indicate a feature, a region, an integer, a step, an operation, an element, and/or a component that is recorded in the present disclosure, but do not exclude one or more other features, regions, integers, steps, operations, elements, components and/or groups thereof.

When it is said that an element is "connected" or "coupled" to another element, the element may be directly connected to or coupled to the another element, or an additional element may exist between the element and the another element. In contrast, when an element is "directly connected" or "directly coupled" to another element, no additional element exists between the element and the another element.

The term "approximately", "about" or "nearly" used herein should usually mean that an error of a value is within 20 percent of a given value or range, or preferably within 10 percent, or more preferably within 5 percent. Unless specifically indicated, a value maintained herein is considered as an approximate value, that is, an error or a range as indicated by the term "approximately", "about" or "nearly".

Figure 1A:
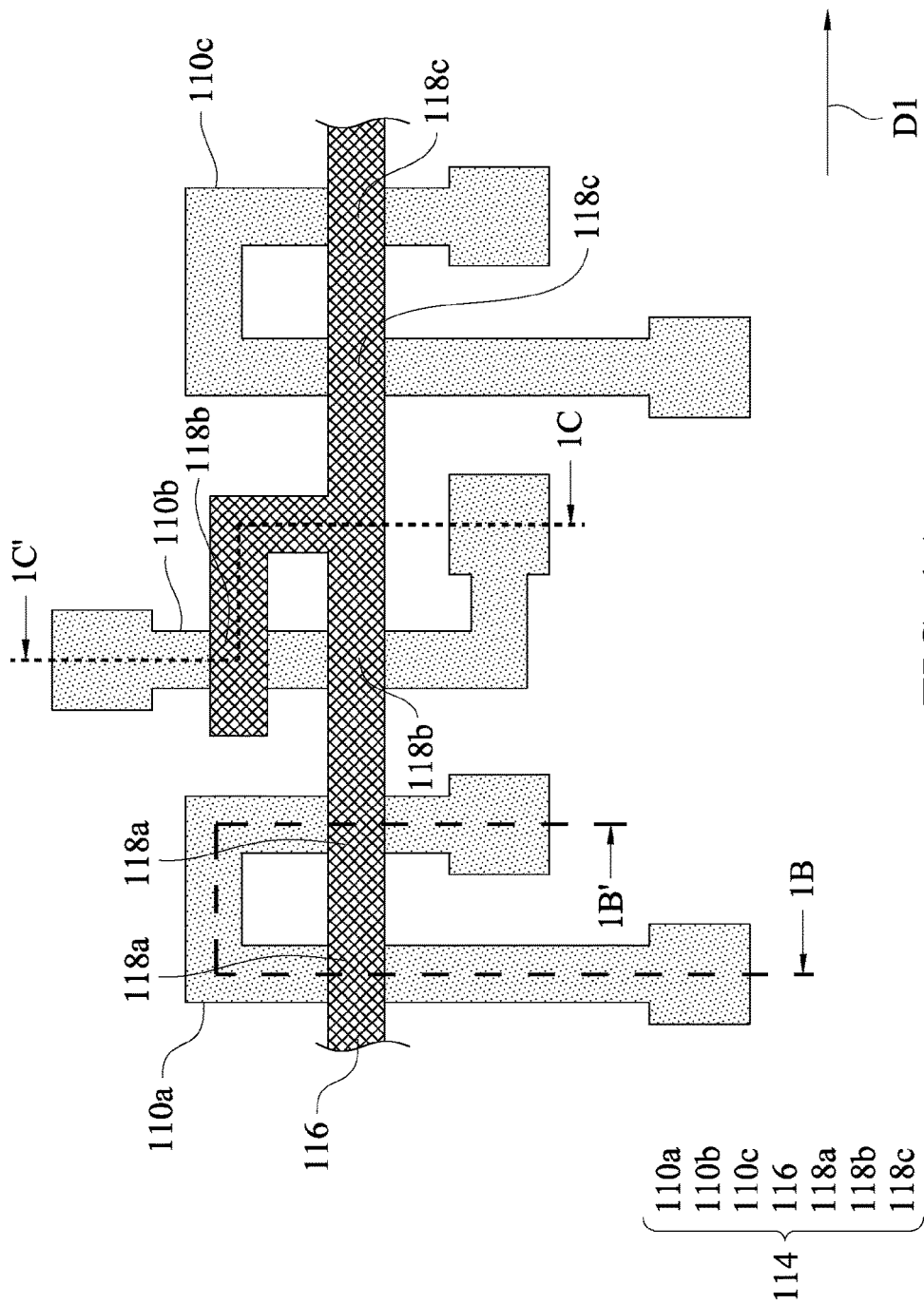
FIG. 1A is a schematic top view of forming a channel layer and a first pattern layer according to some implementation manners of the present disclosure.
Figure 1B:
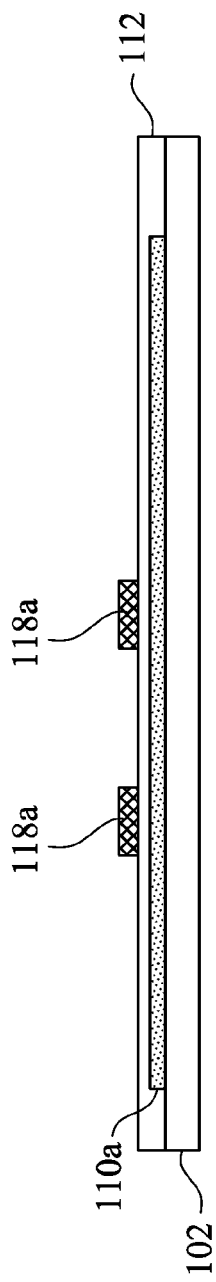
FIG. 1B is a schematic sectional view along line 1B-1B' in FIG. 1A.
Figure 1C:
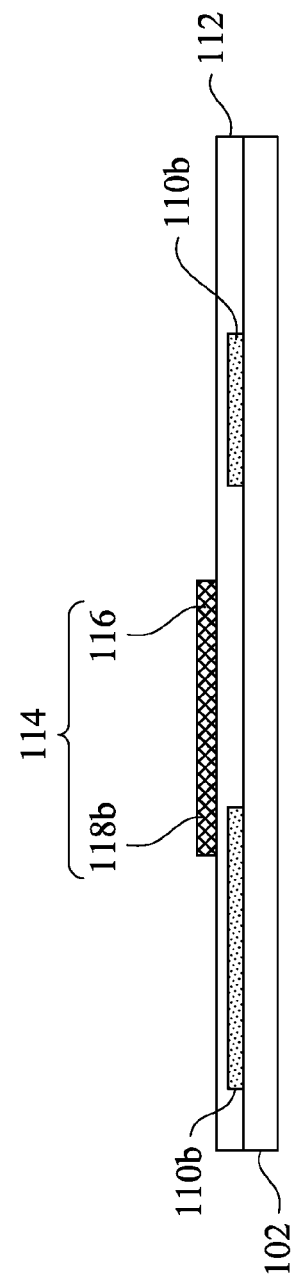
FIG. 1C is a schematic sectional view along line 1C-1C' in FIG. 1A.

Each procedure of a method for manufacturing a pixel unit according to an embodiment of the present invention is described below. Referring to FIG. 1A, FIG. 1B, and FIG. 1C, FIG. 1A is a schematic top view of forming a channel layer and a first pattern layer 114 according to some implementation manners of the present disclosure, FIG. 1B is a schematic sectional view along line 1B-1B' in FIG. 1A, and FIG. 1C is a schematic sectional view along line 1C-1C' in FIG. 1A. At this manufacturing stage, channel layers 110a, 110b, and 110c are first formed on a substrate 102, the channel layers 110a, 110b, and 110c correspond to three sequentially arranged pixels, and the channel layer 110b is located between the channel layer 110a and the channel layer 110c. Shapes, size and/or orientations of the channel layer 110a and the channel layer 110c may be the same. In FIG. 1A, opening directions of the channel layer 110a and the channel layer 110c are, for example, the same. An opening direction of the channel layer 110b is different from the opening direction of the channel layer 110a. In an example in which FIG. 1A is viewed from the front, an opening of the channel layer 110a faces toward the bottom, and an opening of the channel layer 110b faces toward an upper right corner, so that the opening direction of the channel layer 110b and the opening direction of the channel layer 110a form an obtuse angle. A first insulation layer 112 is formed on the channel layers 110a, 110b, and 110c and covers the channel layers 110a, 110b, and 110c. Subsequently, the first pattern layer 114 is disposed on the first insulation layer 112, and includes a scan line 116 and gate electrodes 118a, 118b, and 118c. The scan line 116 may extend along a first direction D1. A vertical projection of the gate electrode 118 of the first pattern layer 114 onto the substrate 102 may at least partially overlap with a vertical projection of the channel layer 110a onto the substrate 102. That is, when the channel layer 110a and the first pattern layer 114 are viewed from the top in a direction perpendicular to the substrate 102, an overlapped part between the first pattern layer 114 and the channel layer 110a may be considered as the gate electrode 118a of the first pattern layer 114. Similarly, an overlapped part between the first pattern layer 114 and the channel layer 110b may be considered as the gate electrode 118b of the first pattern layer 114, and an overlapped part between the first pattern layer 114 and the channel layer 110c may be considered as the gate electrode 118c of the first pattern layer 114. In this implementation manner, the channel layer 110a corresponds to two gate electrodes 118a, that is, a dual-gate electrode structure. The channel layers 110b and 110c have similar situations, and details are not described herein again.

Figure 2A:
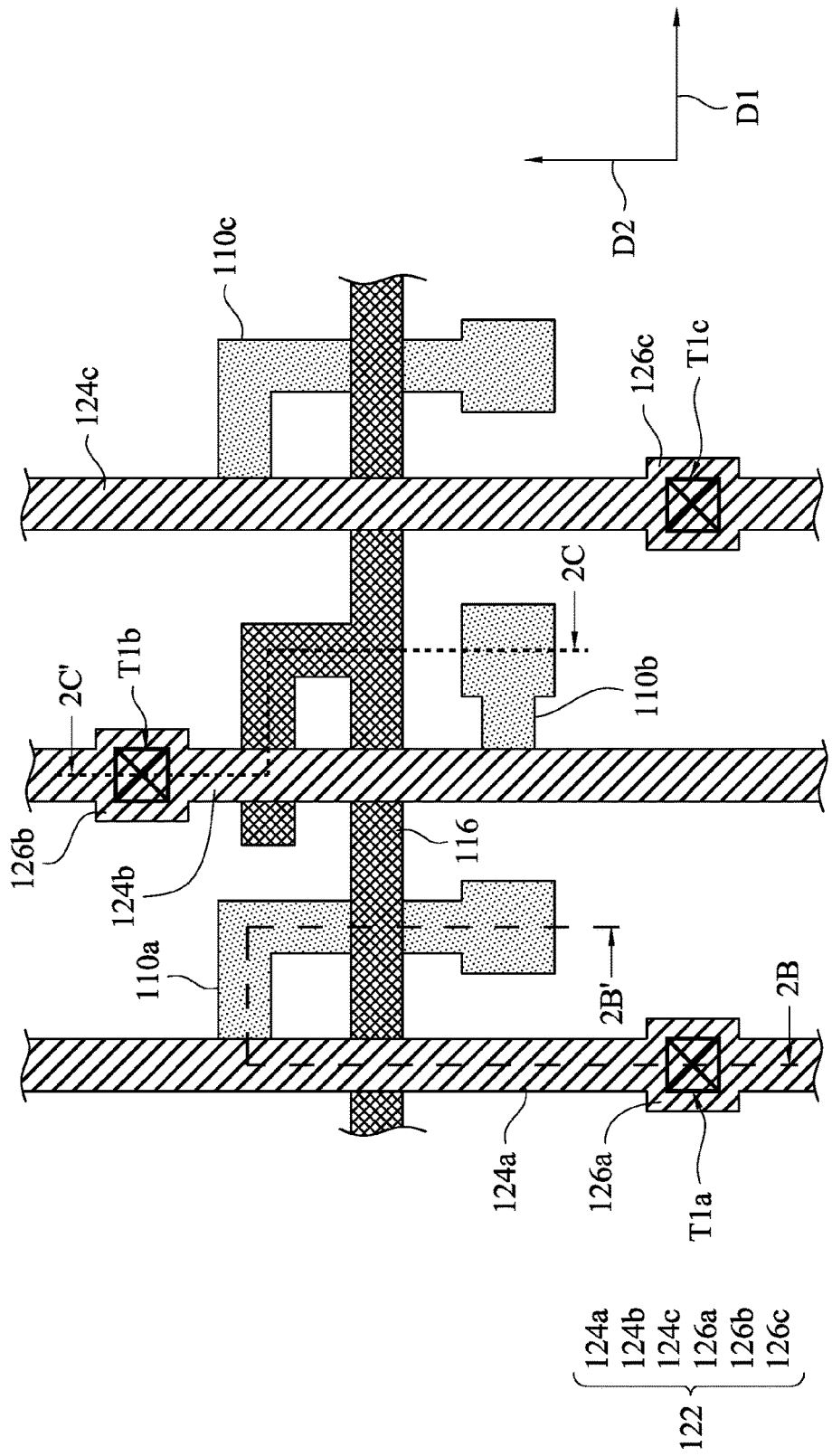
FIG. 2A is a schematic top view of forming a second pattern layer according to some implementation manners of the present disclosure.
Figure 2B:
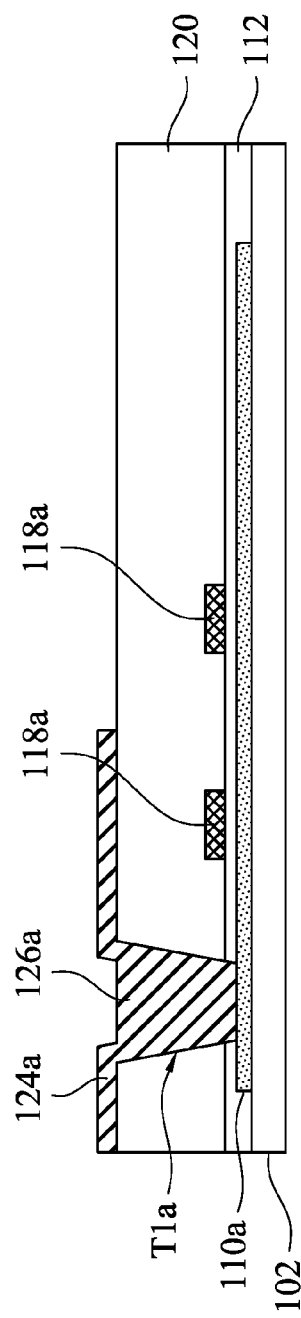
FIG. 2B is a schematic sectional view along line 2B-2B' in FIG. 2A.
Figure 2C:
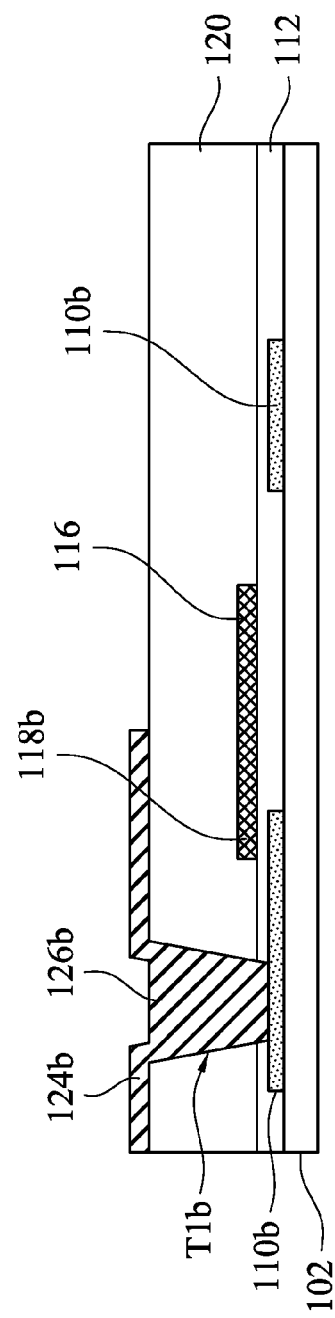
FIG. 2C is a schematic sectional view along line 2C-2C' in FIG. 2A.

Referring to FIG. 2A, FIG. 2B, and FIG. 2C, FIG. 2A is a schematic top view of forming a second pattern layer 122 according to some implementation manners of the present disclosure, FIG. 2B is a schematic sectional view along line 2B-2B' in FIG. 2A, and FIG. 2C is a schematic sectional view along line 2C-2C' in FIG. 2A. At this manufacturing stage, a second insulation layer 120 is formed on a first insulation layer 112 and covers a first pattern layer 114, and subsequently, one part of the first insulation layer 112 and one part of the second insulation layer 120 are removed, so that the first insulation layer 112 and the second insulation layer 120 share first contact holes T1a, T1b, and T1c. After the first contact holes T1a, T1b, and T1c are formed, parts of channel layers 110a, 110b, and 110c may be respectively exposed through the first contact holes T1a, T1b, and T1c. Subsequently, the second pattern layer 122 is further formed above the channel layers 110a, 110b, and 110c, the first pattern layer 114, and the second insulation layer 120. The second pattern layer 122 may be isolated from the first pattern layer 114 by means of the second insulation layer 120.

The second pattern layer 122 includes data lines 124a, 124b, and 124c and source electrodes 126a, 126b, and 126c. The data lines 124a, 124b, and 124c may respectively extend along a second direction D2, the data lines 124a, 124b, and 124c may be sequentially arranged along a first direction D1, and the second direction D2 is substantially orthogonal to the first direction D1. That is, an extending direction of scan lines 116a, 116b, and 116c and an extending direction of the data lines 124a, 124b, and 124c are substantially orthogonal to each other, so as to define pixel regions. A vertical projection of one part of the source electrode 126a onto the substrate 102 may at least partially overlap with a vertical projection of the channel layer 110a onto the substrate 102, and this part of the source electrode 126a may be filled into the first contact hole T1a to be electrically connected to the channel layer 110a through the first contact hole T1a. A vertical projection of one part of the source electrode 126b onto the substrate 102 may at least partially overlap with a vertical projection of the channel layer 110b onto the substrate 102, and this part of the source electrode 126b may be filled into the first contact hole T1b to be electrically connected to the channel layer 110b through the first contact hole T1b. A vertical projection of one part of the source electrode 126c onto the substrate 102 may at least partially overlap with a vertical projection of the channel layer 110c onto the substrate 102, and this part of the source electrode 126c may be filled into the first contact hole T1c to be electrically connected to the channel layer 110c through the first contact hole T1c.

Figure 3A:
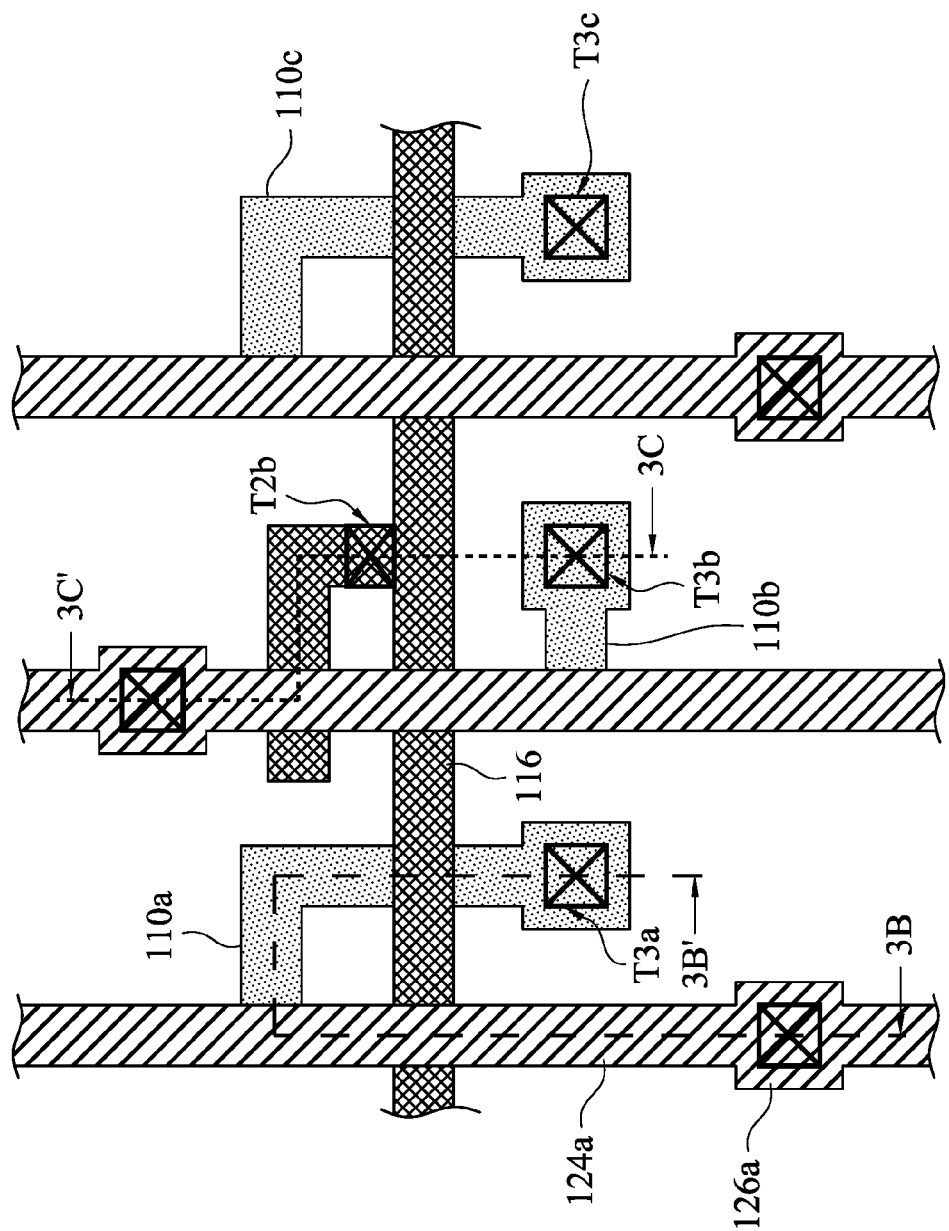
FIG. 3A is a schematic top view of forming a second contact hole and a third contact hole according to some implementation manners of the present disclosure.
Figure 3B:
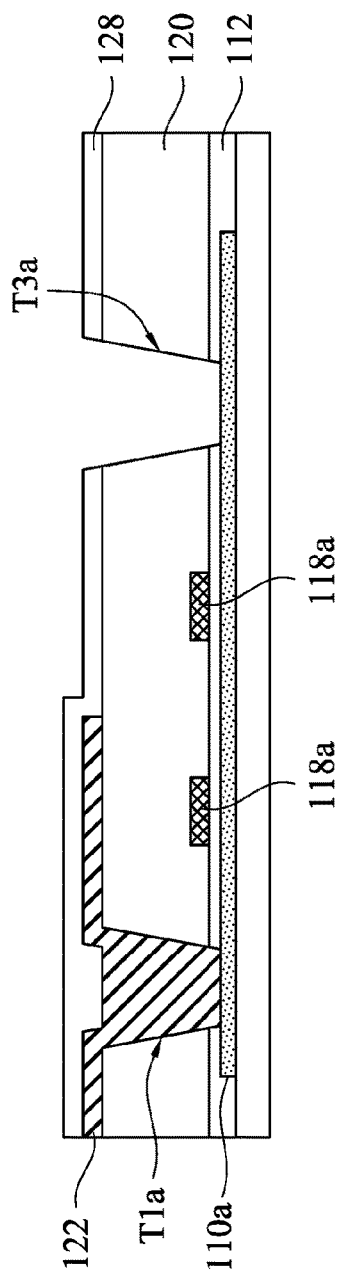
FIG. 3B is a schematic sectional view along line 3B-3B' in FIG. 3A.
Figure 3C:
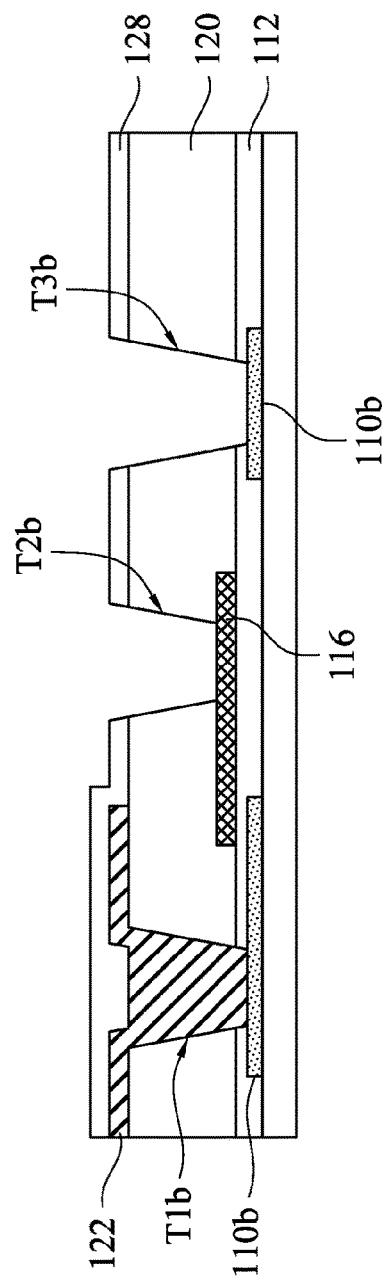
FIG. 3C is a schematic sectional view along line 3C-3C' in FIG. 3A.

Referring to FIG. 3A, FIG. 3B, and FIG. 3C, FIG. 3A is a schematic top view of forming a second contact hole T2b and third contact holes T3a, T3b, and T3c according to some implementation manners of the present disclosure, FIG. 3B is a schematic sectional view along line 3B-3B' in FIG. 3A, and FIG. 3C is a schematic sectional view along line 3C-3C' in FIG. 3A. At this manufacturing stage, a third insulation layer 128 is formed on a second insulation layer 120 and covers a second pattern layer 122. The thickness of the third insulation layer 128 is, for example, greater than or equal to 2000 Å, and the material of the third insulation layer 128 is, for example, silicon oxide. Subsequently, one part of a first insulation layer 112, one part of the second insulation layer 120, and one part of the third insulation layer 128 are removed, so that the second insulation layer 120 and the third insulation layer 128 share the second contact hole T2b, and the first insulation layer 112, the second insulation layer 120, and the third insulation layer 128 share the third contact holes T3a, T3b, and T3c. After the second contact hole T2b and the third contact holes T3a, T3b, and T3c are formed, some scan lines 116 may be exposed through the second contact hole T2b, and parts of channel layers 110a, 110b, and 110c may be respectively exposed through the third contact holes T3a, T3b, and T3c.

Figure 4A:
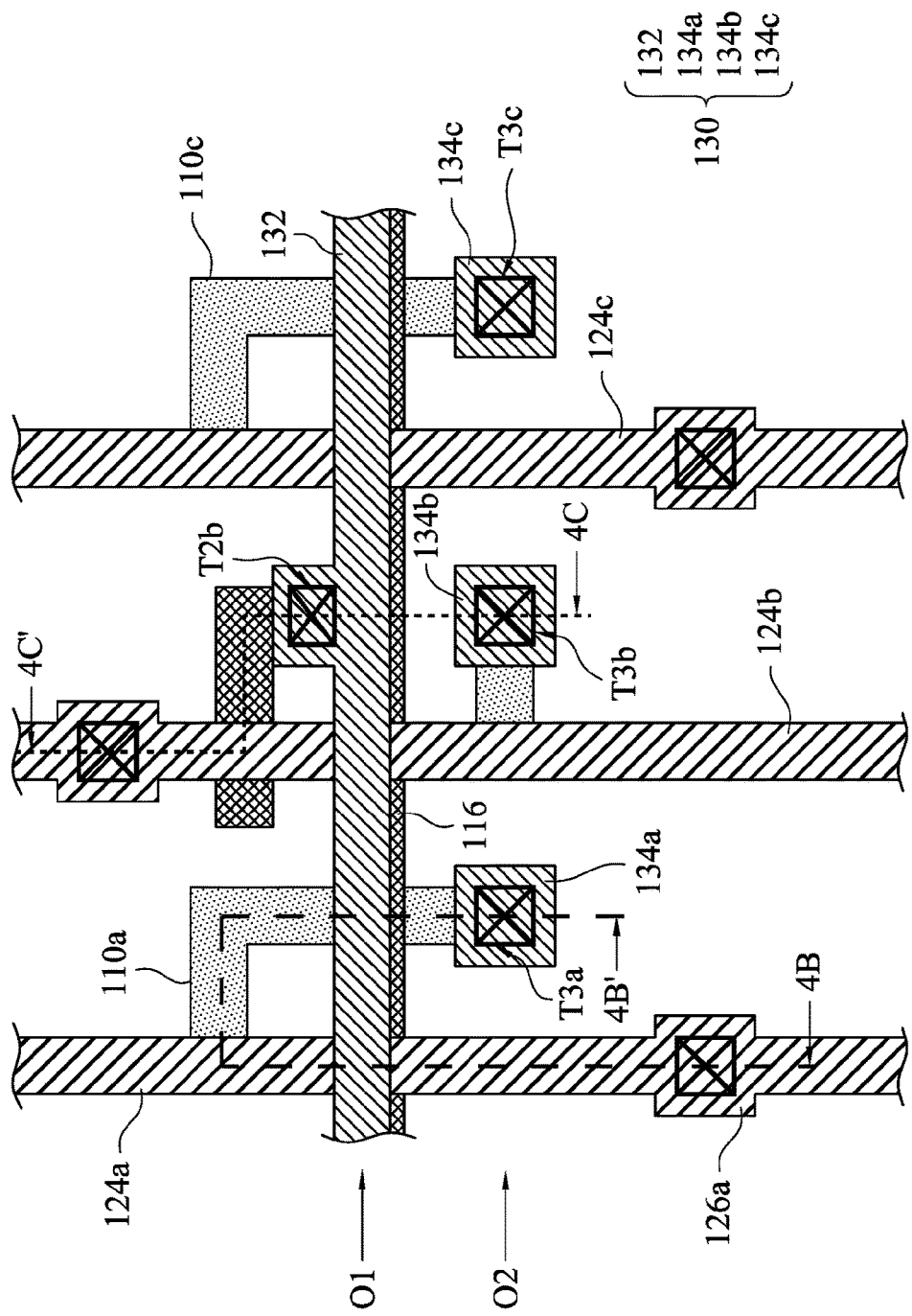
FIG. 4A is a schematic top view of forming a third pattern layer according to some implementation manners of the present disclosure.
Figure 4B:
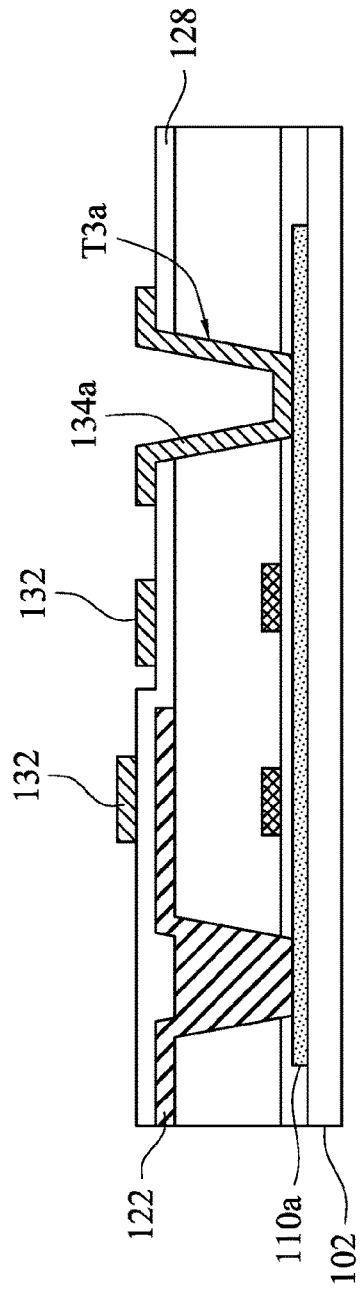
FIG. 4B is a schematic sectional view along line 4B-4B' in FIG. 4A.
Figure 4C:
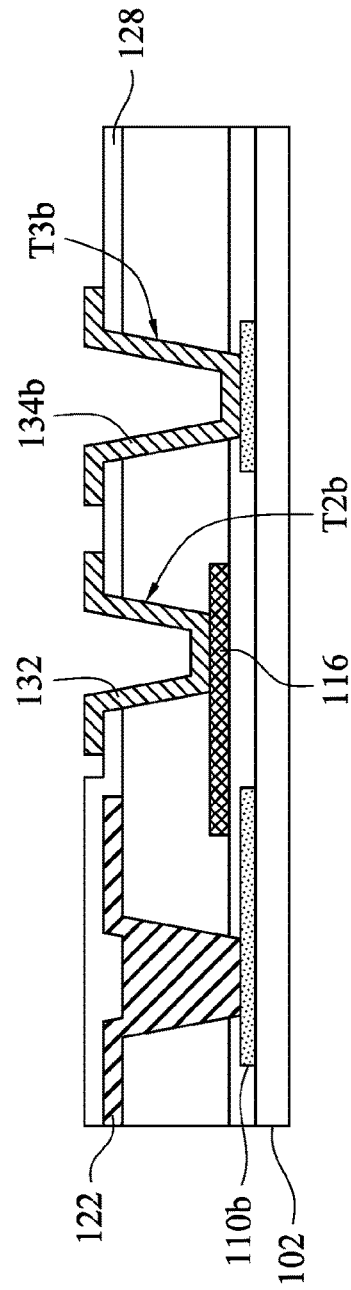
FIG. 4C is a schematic sectional view along line 4C-4C' in FIG. 4A.

Referring to FIG. 4A, FIG. 4B, and FIG. 4C, FIG. 4A is a schematic top view of forming a third pattern layer 130 according to some implementation manners of the present disclosure, FIG. 4B is a schematic sectional view along line 4B-4B' in FIG. 4A, and FIG. 4C is a schematic sectional view along line 4C-4C' in FIG. 4A. At this manufacturing stage, the third pattern layer 130 is formed on a third insulation layer 128, and the third pattern layer 130 includes an auxiliary electrode 132 and drain electrodes 134a, 134b, and 134c. As shown in FIG. 4C, one part of the auxiliary electrode 132 is located inside a second contact hole T2b, so that the auxiliary electrode 132 is electrically connected to a scan line 116 through the second contact hole T2b. The drain electrode 134a is electrically connected to a channel layer 110a through a third contact hole T3a, the drain electrode 134b is electrically connected to a channel layer 110b through a third contact hole T3b, and the drain electrode 134c is electrically connected to a channel layer 110c through a third contact hole T3c.

Because a step of forming a third insulation layer 128 is posterior to a step of forming a second pattern layer 122 and is prior to a step of forming a third pattern layer 130, the second pattern layer 122 and the third pattern layer 130 may be considered to be formed on different planes. That is, when being observed along a horizontal direction, parts of data lines 124a, 124b, and 124c do not overlap with the auxiliary electrode 132. For example, when being observed at position O1 in first horizontal direction in FIG. 4A, the data line 124a does not overlap with the auxiliary electrode 132, the data line 124b does not overlap with the auxiliary electrode 132, and the data line 124c does not overlap with the auxiliary electrode 132. That is, the data lines 124a, 124b, and 124c and the auxiliary electrode 132 are not on a same horizontal plane. When being observed at position O2 in second horizontal direction in FIG. 4A, although the data line 124a overlaps with one part of the drain electrode 134a, the data line 124a does not overlap with the other part of the drain electrode 134a. That is, one part of the drain electrode 134a that is located above the third insulation layer 128 and the data line 124a are not located on a same horizontal plane. Similarly, the data line 124b and the drain electrode 134b, and the data line 124c and the drain electrode 134c have the foregoing correspondence. Details are not described herein again.

By means of the configuration, a yield of a formed structure may be improved. For example, as shown in 4A, when the formed structure is viewed in a direction perpendicular to a substrate 102, because the second pattern layer 122 and the third pattern layer 130 may be considered to be formed on different horizontal planes, a short-circuit due to an etching issue between the data line 124a and the drain electrode 134a, between the data line 124b and the drain electrode 134b, and between the data line 124c and the drain electrode 134c may be prevented. For example, a short-circuit due to respective connections between the data lines 124a, 124b, and 124c and conductors inside the third contact holes T3a, T3b, and T3c may be prevented. Similarly, a short-circuit due to a connection between the data line 124b and a conductor inside the second contact hole T2b may also be prevented, and a short-circuit due to an etching issue between the data line 124b and the auxiliary electrode 132 may also be prevented. Therefore, by means of the foregoing manufacturing sequence, the performed process may have a broader design rule, and would not be limited by an etching step. On the other hand, because a short-circuit caused due to etching issue is prevented, even if the foregoing process is applied to a panel with a large size designed to have high resolution, the performed process may still have a specific yield, so as to prevent display quality from being affected.

In addition, after the third pattern layer 130 is formed, the auxiliary electrode 132 of the third pattern layer 130 and the scan line 116 are configured to be connected in parallel to each other. By means of the parallel connection configuration, the auxiliary electrode 132 may reduce impedance of the scan line 116, so as to reduce resistance-capacitance product values (RC values) of the scan line 116 and the gate electrode 118 (referring to FIG. 1A). For example, when the material of the scan line 116 includes molybdenum, the material of the auxiliary electrode 132 may include aluminum, copper, titanium, or molybdenum, so as to reduce the impedance of the scan line 116 by means of the parallel connection configuration.

Figure 5A:
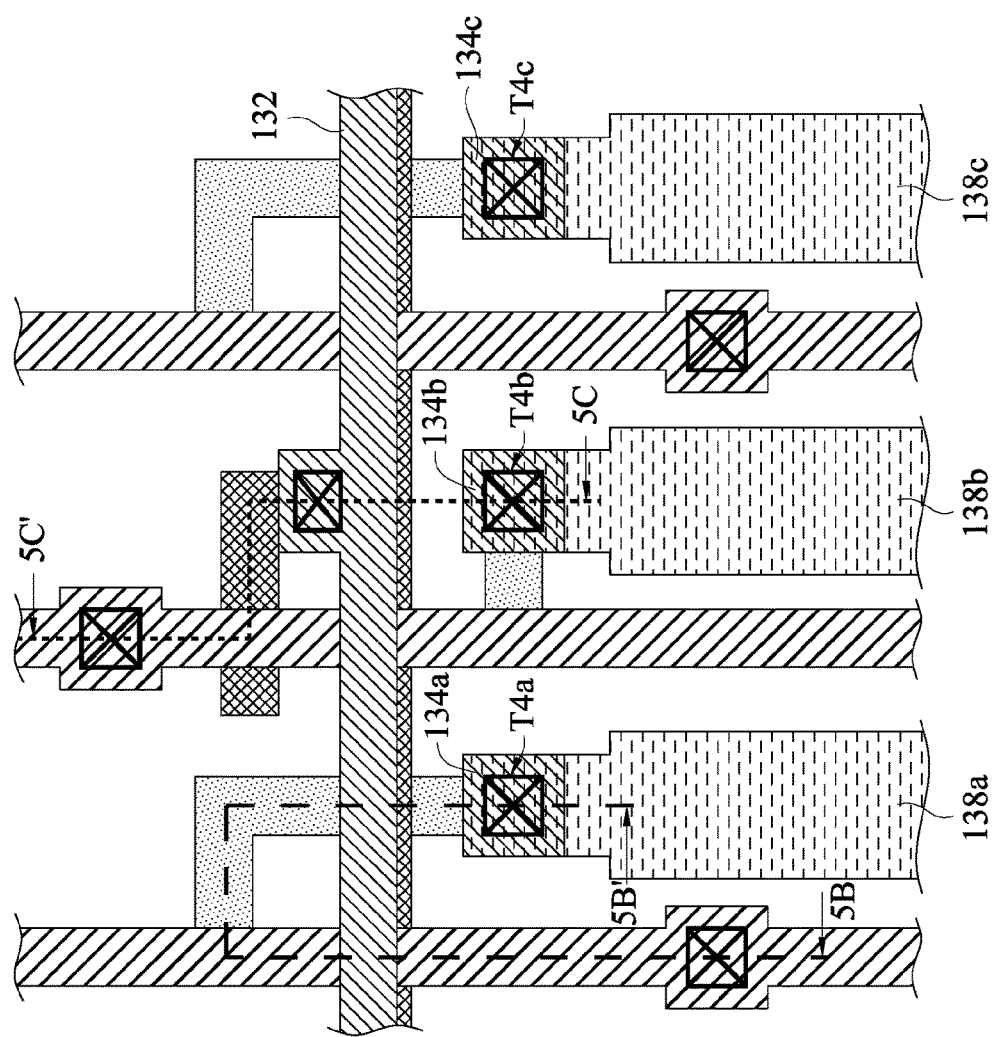
FIG. 5A is a schematic top view of forming a first electrode according to some implementation manners of the present disclosure.
Figure 5B:
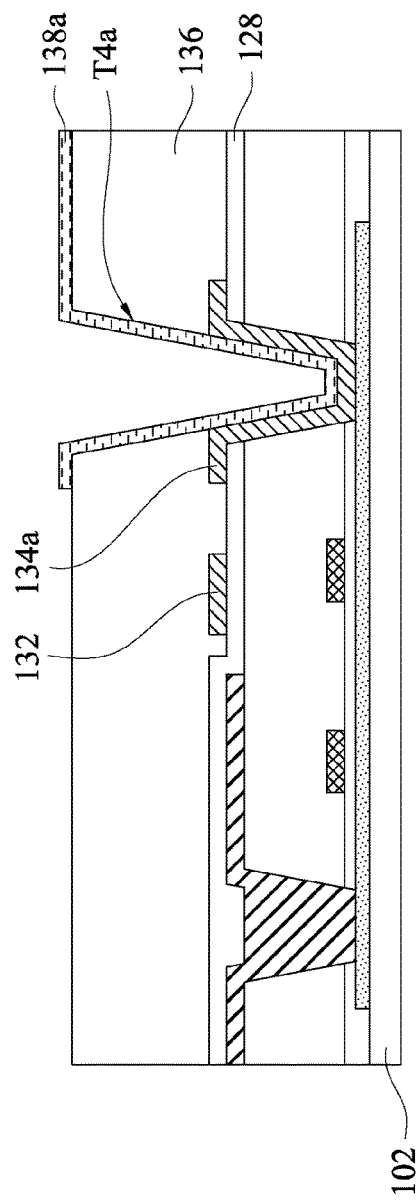
FIG. 5B is a schematic sectional view along line 5B-5B' in FIG. 5A.
Figure 5C:
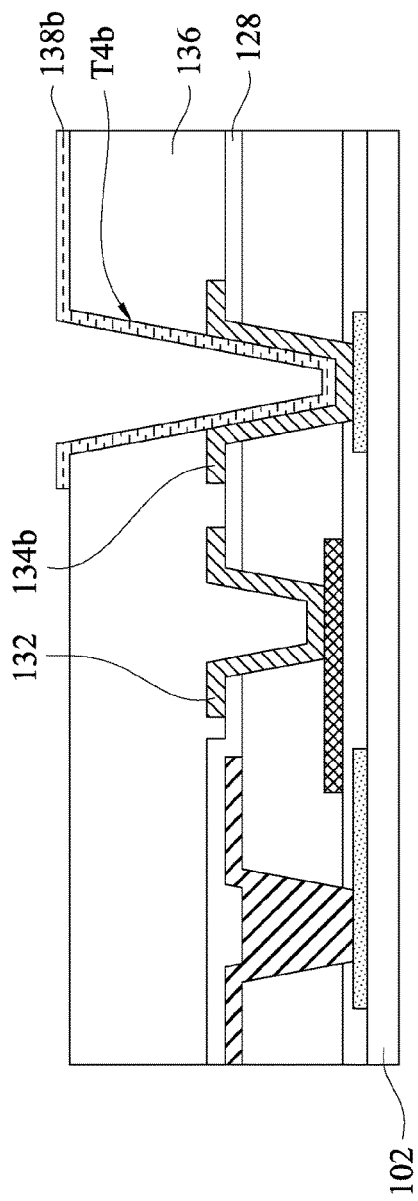
FIG. 5C is a schematic sectional view along line 5C-5C' in FIG. 5A.

Referring to FIG. 5A, FIG. 5B, and FIG. 5C, FIG. 5A is a schematic top view of forming a first electrode according to some implementation manners of the present disclosure, FIG. 5B is a schematic sectional view along line 5B-5B' in FIG. 5A, and FIG. 5C is a schematic sectional view along line 5C-5C' in FIG. 5A. At this manufacturing stage, a planarization layer 136 may be first formed on a third insulation layer 128, and covers an auxiliary electrode 132 and drain electrodes 134a, 134b, and 134c of a third pattern layer 130. Subsequently, one part of the planarization layer 136 is removed, so that the planarization layer 136 has fourth contact holes T4a, T4b, and T4c. After the fourth contact holes T4a, T4b, and T4c are formed, first parts of the drain electrodes 134a, 134b, and 134c may be respectively exposed through the fourth contact holes T4a, T4b, and T4c. First electrodes 138a, 138b, and 138c are formed on the planarization layer 136. A vertical projection of the first electrode 138a onto a substrate 102 may at least partially overlap with a vertical projection of the drain electrode 134a onto the substrate 102, and one part of the first electrode 138a may be filled into the fourth contact hole T4a, so as to be electrically connected to the drain electrode 134a through the fourth contact hole T4a. A vertical projection of the first electrode 138b onto the substrate 102 may at least partially overlap with a vertical projection of the drain electrode 134b onto the substrate 102, and one part of the first electrode 138b may be filled into the fourth contact hole T4b, so as to be electrically connected to the drain electrode 134b through the fourth contact hole T4b. A vertical projection of the first electrode 138c onto the substrate 102 may at least partially overlap with a vertical projection of the drain electrode 134c onto the substrate 102, and one part of the first electrode 138c may be filled into the fourth contact hole T4c, so as to be electrically connected to the drain electrode 134c through the fourth contact hole T4c.

Figure 6A:
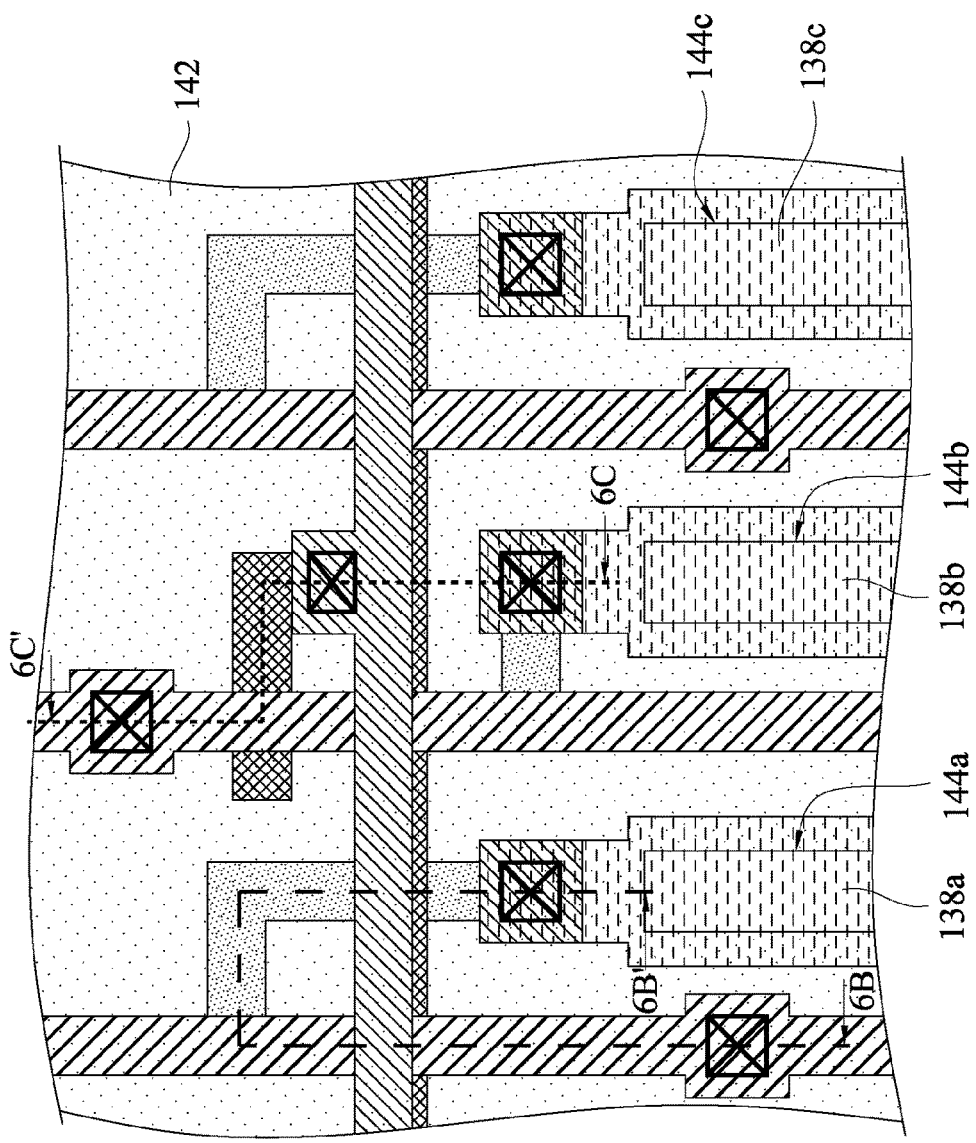
FIG. 6A is a schematic top view of forming a second electrode according to some implementation manners of the present disclosure.
Figure 6B:
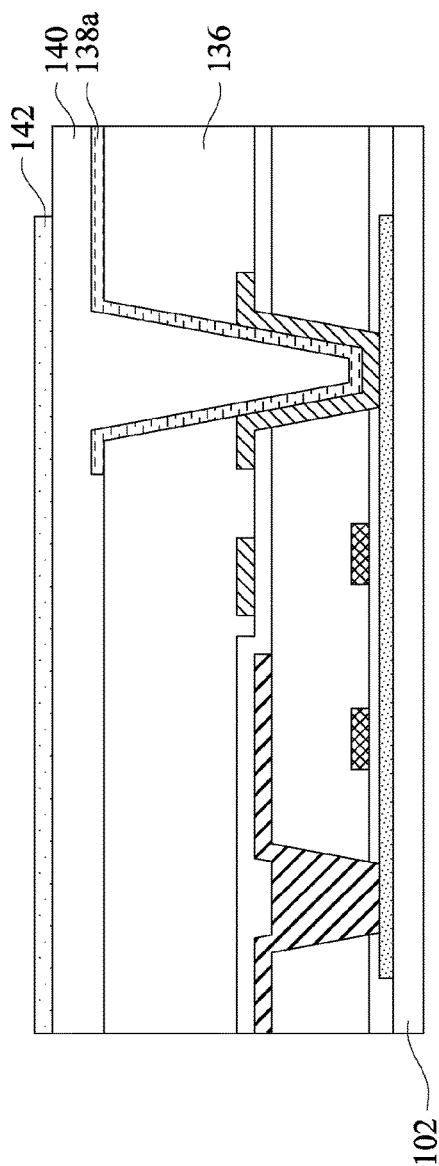
FIG. 6B is a schematic sectional view along line 6B-6B' in FIG. 6A.
Figure 6C:
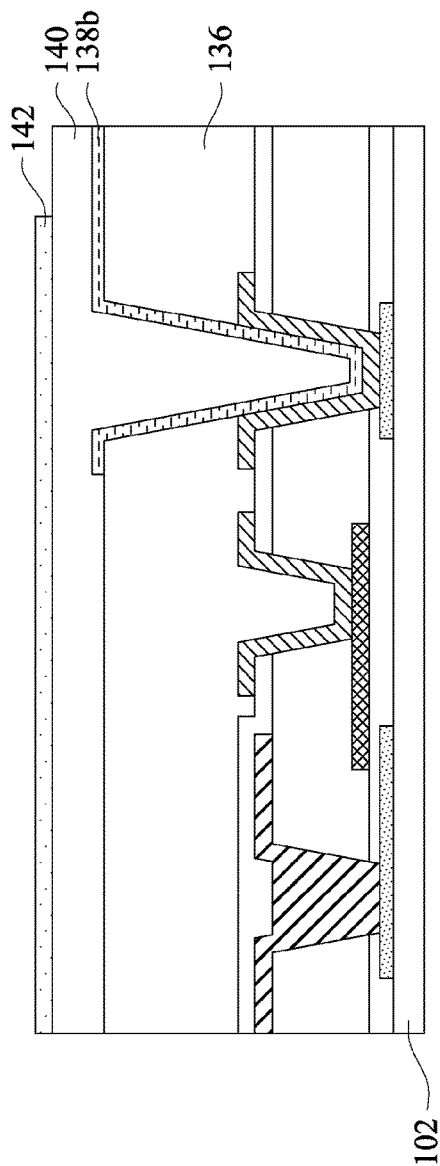
FIG. 6C is a schematic sectional view along line 6C-6C' in FIG. 6A.

Referring to FIG. 6A, FIG. 6B, and FIG. 6C, FIG. 6A is a schematic top view of forming a second electrode according to some implementation manners of the present disclosure, FIG. 6B is a schematic sectional view along line 6B-6B' in FIG. 6A, and FIG. 6C is a schematic sectional view along line 6C-6C' in FIG. 6A. At this manufacturing stage, a passivation layer 140 may be first formed on a planarization layer 136 and covers first electrodes 138a and 138b. The thickness of the passivation layer 140 is, for example, 1000 Å, and the material of the passivation layer 140 is, for example, silicon nitride. Subsequently, the second electrode 142 may be formed on the passivation layer 140, and is isolated from the first electrodes 138a and 138b by means of the passivation layer 140. The second electrode 142 has openings 144a, 144b, and 144c, and when the second electrode 142 is viewed in a direction perpendicular to the substrate 102, the openings 144a, 144b, and 144c respectively fall within corresponding pixel regions, and the openings 144a, 144b, and 144c respectively overlap with first electrodes 138a, 138b, and 138c.

In a combination of the first electrodes 138a, 138b, and 138c and the second electrode 142, one of them may serve as a pixel electrode, and the other one may serve as a common electrode, for controlling alignment of liquid crystal molecules (not shown) by means of an electric field therebetween. After the second electrode 142 is formed, a combination of structures of layers on the substrate 102 may serve as a pixel unit, and a combination of the substrate 102 and the pixel unit may be considered as an array substrate.

In conclusion, a method for manufacturing a pixel unit is provided. In a process of manufacturing the pixel unit, a step of forming a data line is prior to a step of forming a conductor electrically connected to a channel layer and a scan line, and at least one step of forming an insulation layer is between the two steps, so that a short-circuit due to a connection between the data line and a conductor inside a contact hole can be prevented. Therefore, the performed process may have a broader design rule and have a better yield. On the other hand, an auxiliary electrode connected in parallel to a scan line may be formed, and by means of the auxiliary electrode, impedance of the scan line may be reduced, so as to reduce an RC value of a gate electrode.

Although the present invention is disclosed as above by using multiple implementation manners, these implementation manners are not used to limit the present invention. Any person skilled in the art may make various changes and modifications without departing from the spirit and scope of the present invention, and therefore the protection scope of the present invention should be as defined by the appended claims.

What is claimed is:

1. A method for manufacturing a pixel unit, comprising:
   forming a channel layer on a substrate;
   forming a first pattern layer above the channel layer, the first pattern layer comprising a scan line and a gate electrode;
   forming a second pattern layer above the first pattern layer, the second pattern layer comprising a data line and a source electrode, wherein the source electrode is electrically connected to the channel layer; and
   forming a third pattern layer above the second pattern layer, the third pattern layer comprising a drain electrode and an auxiliary electrode, wherein the drain electrode is not overlapped with the second pattern layer along a vertical projection direction of the substrate, the drain electrode is electrically connected to the channel layer through a third contact hole, the second pattern layer is not overlapped with the third contact hole along the vertical projection direction of the substrate, and the auxiliary electrode is electrically connected to the scan line through a first contact hole.

2. The method for manufacturing a pixel unit according to claim 1, further comprising:
   forming a first electrode and a second electrode above the third pattern layer.

3. The method for manufacturing a pixel unit according to claim 2, further comprising:
   forming a planarization layer above the third pattern layer, and forming a second contact hole in the planarization layer, wherein the first electrode is located above the planarization layer, and is electrically connected to the drain electrode through the second contact hole.

4. The method for manufacturing a pixel unit according to claim 2, wherein one part of the auxiliary electrode is located inside the first contact hole, and when being observed at a first position in a first horizontal direction, the data line does not overlap with the other part of the auxiliary electrode.

5. The method for manufacturing a pixel unit according to claim 4, wherein one part of the drain electrode is located inside the third contact hole, wherein when being observed at a second position in a second horizontal direction, the data line does not overlap with the other part of the drain electrode.

6. The method for manufacturing a pixel unit according to claim 1, further comprising:
   forming an insulation layer, wherein the step of forming the insulation layer is posterior to the step of forming the second pattern layer, and is prior to the step of forming the third pattern layer, and the first contact hole at least passes through the insulation layer.

7. The method for manufacturing a pixel unit according to claim 1, wherein the drain electrode is directly electrically connected to the channel layer through the third contact hole.

8. A pixel unit, disposed on a substrate and comprising:
   a channel layer, disposed on the substrate;
   a first insulation layer, covering the channel layer;
   a first pattern layer, disposed on the first insulation layer and comprising a scan line and a gate electrode, wherein a vertical projection of the gate electrode onto the substrate at least partially overlaps with a vertical projection of the channel layer onto the substrate;
   a second insulation layer, disposed on the first insulation layer and covering the first pattern layer, wherein the first insulation layer and the second insulation layer share a first contact hole;
   a second pattern layer, disposed on the second insulation layer and comprising a data line and a source electrode, wherein the source electrode is electrically connected to the channel layer through the first contact hole;
   a third insulation layer, disposed on the second insulation layer and covering the second pattern layer, wherein the second insulation layer and the third insulation layer share a second contact hole, and the first insulation layer, the second insulation layer, and the third insulation layer share a third contact hole; and
   a third pattern layer, disposed on the third insulation layer and comprising a drain electrode and an auxiliary electrode, wherein the drain electrode is not overlapped with the second pattern layer along a vertical projection direction of the substrate, the auxiliary electrode is electrically connected to the scan line through the second contact hole, the drain electrode is electrically connected to the channel layer through the third contact hole, and the second pattern layer is not overlapped with the third contact hole along the vertical projection direction of the substrate.

9. The pixel unit according to claim 8, wherein when being observed at a first position in a first horizontal direction, one part of the data line does not overlap with the auxiliary electrode.

10. The pixel unit according to claim 9, wherein one part of the drain electrode is located inside the third contact hole, and when being observed at a second position in a second horizontal direction, the data line does not overlap with the other part of the drain electrode.

11. The pixel unit according to claim 8, wherein one part of the auxiliary electrode is located inside the second contact hole, and when being observed at a first position in a first horizontal direction, the data line does not overlap with the other part of the auxiliary electrode.

12. The pixel unit according to claim 8, further comprising:
   a planarization layer, covering the third pattern layer and comprising a fourth contact hole;

a first electrode, disposed on the planarization layer and electrically connected to the drain electrode through the fourth contact hole;

a passivation layer, covering the first electrode; and a second electrode, disposed on the planarization layer and isolated from the first electrode by the passivation layer.

13. A method for manufacturing a pixel unit, comprising:

forming a channel layer on a substrate;

forming a first pattern layer above the channel layer, the first pattern layer comprising a scan line and a gate electrode;

forming a second pattern layer above the first pattern layer, the second pattern layer comprising a data line and a source electrode, wherein the source electrode is electrically connected to the channel layer through a first contact hole; and forming a third pattern layer above the second pattern layer, the third pattern layer comprising a drain electrode and an auxiliary electrode, wherein the auxiliary electrode is electrically connected to the scan line through a second contact hole, the drain electrode is electrically connected to the channel layer through a third contact hole, and the auxiliary electrode is not overlapped with the first contact hole along a vertical projection direction of the substrate.

14. The method for manufacturing a pixel unit according to claim 13, further comprising:

forming a first electrode and a second electrode above the third pattern layer.

15. The method for manufacturing a pixel unit according to claim 13, further comprising:

forming an insulation layer, wherein the step of forming the insulation layer is posterior to the step of forming the second pattern layer, and is prior to the step of forming the third pattern layer, and the second contact hole at least passes through the insulation layer.

\* \* \* \* \*